United States Patent
Björklund et al.

(10) Patent No.: US 8,823,413 B2
(45) Date of Patent: Sep. 2, 2014

(54) DIGITAL INPUT WITH VARIABLE IMPEDANCE

(75) Inventors: Hans Björklund, Ludvika (SE); Krister Nyberg, Smedjebacken (SE); Tommy Segerbäck, Ludvika (SE)

(73) Assignee: ABB Technology AG, Zürich (CH)

( * ) Notice: Subject to any disclaimer, the term of this patent is extended or adjusted under 35 U.S.C. 154(b) by 16 days.

(21) Appl. No.: 13/822,977

(22) PCT Filed: Sep. 16, 2010

(86) PCT No.: PCT/EP2010/063621
§ 371 (c)(1),
(2), (4) Date: Mar. 13, 2013

(87) PCT Pub. No.: WO2012/034594
PCT Pub. Date: Mar. 22, 2012

(65) Prior Publication Data
US 2013/0181745 A1    Jul. 18, 2013

(51) Int. Cl.
*H03K 17/16*     (2006.01)
*H03K 19/003*    (2006.01)

(52) U.S. Cl.
USPC .................. 326/31; 326/15; 326/21; 326/30

(58) Field of Classification Search
None
See application file for complete search history.

(56) References Cited

U.S. PATENT DOCUMENTS

| | | | | |
|---|---|---|---|---|
| 4,719,409 A | * | 1/1988 | Dorman | 324/681 |
| 6,084,434 A | | 7/2000 | Keeth | |
| 7,978,114 B2 | * | 7/2011 | Nakai | 341/155 |
| 2007/0133236 A1 | | 6/2007 | Usui | |

FOREIGN PATENT DOCUMENTS

| | | | |
|---|---|---|---|
| JP | 7-115685 A | | 5/1995 |
| WO | WO 2008/148793 A1 | | 12/2008 |

* cited by examiner

*Primary Examiner* — Ahn Tran
(74) *Attorney, Agent, or Firm* — Birch, Stewart, Kolasch & Birch, LLP

(57) ABSTRACT

A device for sensing a binary signal includes a device configured to measure a signal level of the signal, a device configured to determine whether the measured signal level is "low" or "high", a device configured to provide a variable input impedance, and a device configured to control the input impedance in response to the measured signal level. The variable input impedance may be provided by way of a transistor and a resistor, and by controlling the duty ratio of the transistor using pulse width modulation. Preferably, the input impedance is controlled to be low for low signal levels and to be high for high signal levels, which results in a more reliable sensing of binary signals. The device may be used for detecting the state of contact transducers suffering from parasitic resistances caused by moist and/or polluted environments. Further, a method of sensing a binary signal is provided.

16 Claims, 4 Drawing Sheets

DIGITAL INPUT WITH VARIABLE IMPEDANCE

FIELD OF THE INVENTION

The invention relates in general to the processing of digital signals, and more specifically to the sensing of digital input signals.

BACKGROUND OF THE INVENTION

In polluted and moist environments, i.e., in areas with high air humidity, digital contact transducers, used, e.g., in electric power distribution systems, can suffer from low parasitic resistances over open contacts. Such low resistances may result in a false detection of signals originating from contact transducers and may subsequently lead to a false determination of a transducer's state. This, in turn, may cause an unwanted shutdown of at least parts of a power transmission system.

Further, digital input circuits powered by a high-impedance grounded battery may also suffer from a false sensing of digital input signals due to ground faults on the battery feeding lines.

In order to make the sensing of digital input signals more reliable, low-impedance digital inputs with long filter times may be used. However, such inputs suffer from high power losses and slow signal detection. An alternative solution, as disclosed in WO 2008/148793 A1, utilizes the rate of change of the input signal level.

SUMMARY OF THE INVENTION

It is an object of the present invention to provide a more efficient alternative to the above techniques and prior art.

More specifically, it is an object of the present invention to provide a more reliable sensing of digital signals.

These and other objects of the present invention are achieved by means of a device having the features defined in independent claim 1, and by means of a method defined in independent claim 9. Embodiments of the invention are characterized by the dependent claims.

For the purpose of describing the present invention, a binary signal is assumed to represent either of two discrete states, referred to as logical states, at any time. The two states are commonly denoted as "high" and "low", or "0" (zero) and "1" (one), respectively. However, while a binary signal may be used to represent either of two distinct states, the signal level of a binary signal is typically fluctuating, e.g., due to noise, grounding issues, unstable power supplies, or bad contacts, and may attain values other than two distinct values. Hence, in order to determine which of either two logical states is represented by a binary signal, the signal level is compared to two non-overlapping signal level ranges associated with the two states. For instance, in the case of active-high logic, the signal is considered to represent the logical-low state if the signal level is within a first, lower, range, and is considered to represent the logical-high state if the signal level is within a second, higher, range. In the case of active-low logic, on the other hand, the correspondence between the logical states and the signal level ranges is reversed. Depending on the technology used to implement an input circuit for sensing binary signals, different voltage levels are used for defining the signal level ranges associated with the logical states.

According to a first aspect of the invention, a device for sensing a binary signal is provided. The device comprises means for measuring a signal level of the signal, means for determining whether the measured signal level represents a logical-low state or a logical-high state, means for providing a variable input impedance, and means for controlling the input impedance. The input impedance is controlled in response to the measured signal level.

According to a second aspect of the invention, a method of sensing a binary signal is provided. The method comprises measuring a signal level of the signal, determining whether the measured signal level represents a logical-low state or a logical-high state, providing a variable input impedance, and controlling the input impedance. The input impedance is controlled in response to the measured signal level.

The present invention makes use of an understanding that the sensing of binary signals, i.e., the determination whether a given binary signal represents the logical-low state or the logical-high state, may be improved by utilizing a variable input impedance in the sensing of the binary signal.

Using a variable input impedance is advantageous in that the input impedance may be adapted to the actual signal level, thereby avoiding, or, at least, mitigating, the drawbacks associated with known digital inputs having a low, fixed, impedance. In particular, adapting the input impedance to the actual level of the input signal allows to optimize the sensing sensitivity and to minimize the influence of disturbances.

According to an embodiment of the invention, the input impedance is controlled to be low for low signal levels and to be high for high signal levels. The terms "low" and "high", used in describing the input impedance and the signal level, are to be understood as indicating the relationship between two limiting cases. In other words, a high input impedance is understood to be considerably higher than a low input impedance. The input impedance may, e.g., be controlled to increase monotonously with increasing signal level.

Using a low input impedance at low signal levels and a high input impedance at high signal levels makes the sensing of binary signals by digital inputs more reliable. More specifically, using a low input impedance only at low signal levels mitigates the disadvantages associated with low-impedance inputs at high signal levels, such as high power losses due to high signal currents. In this way the power dissipation of digital inputs may be kept low, without lowering the disturbance level. Moreover, the sensitivity to disturbances for normally logical-high signals may be much lower if an embodiment according to the invention is used for sensing a binary signal, as compared to fixed-impedance inputs.

Further, an embodiment of the invention is advantageous in that the problems associated with high-impedance grounded battery systems are mitigated, i.e., a false detection of a contact transducer's state as a consequence of a fault on a battery feeding line may be avoided.

According to an embodiment of the invention, the input impedance is controlled to have a first value for signal levels smaller than a first threshold and a second value for signal levels larger than a second threshold. The first value is smaller than the second value, and the first threshold is smaller than, or equal to, the second threshold. In other words, the input impedance is controlled such that it is low up to a certain signal level, the first threshold, and is increased for signal levels above the second threshold. This results in a hysteresis, both for normally logical-low and normally logical-high signals.

According to another embodiment of the invention, the first threshold and the second threshold are equal. In this case, the two thresholds coincide and constitute a transition level for the input impedance which attains a low value below the transition level and a high value above the transition level. In other words, the functional relationship between the input impedance is that of a step function. The transition level may, e.g., be equal to the signal level of the transition between logical-low and logical-high.

According to a further embodiment of the invention, the input impedance is controlled to increase with increasing signal level for signal levels larger than the first threshold and smaller than the second threshold. Thus, if the two thresholds do not coincide, the input impedance may be monotonously increasing with increasing signal level for signal levels between the first and the second threshold. The input impedance may, e.g., be linearly increasing in the region between the first and the second threshold. As an alternative, it may attain one or several constant values, such that the functional relationship between the input impedance and the signal level resembles a combination of multiple step functions.

According to an embodiment of the invention, the means for providing a variable input impedance comprises a bipolar transistor and a resistor, and the means for controlling the input impedance is arranged for controlling the input impedance using pulse width modulation (PWM). The resistor is connected in series with the collector of the transistor. Using a transistor in combination with a resistor is a simple way of providing a variable, and controllable, input impedance. This allows to adjust the input impedance by controlling the duty ratio of the transistor utilizing PWM, as is elucidated further below.

According to an embodiment of the invention, the device may be comprised in a digital input. Configuring a digital input with a device according to the first aspect of the invention is advantageous in that the sensing of binary input signals is made more reliable.

According to an embodiment of the invention, the device may be comprised in a control unit for an electric power distribution system substation. Configuring such a control unit with a device according to the first aspect of the invention is advantageous in that the sensing of binary input signals is made more reliable, thereby avoiding, or at least mitigating, unwanted shutdowns due to a false sensing of a contact transducer's state.

It will be appreciated that an embodiment of the invention may be constructed using electronic components, integrated circuits (ICs), application specific integrated circuits (ASIC), field programmable gate arrays (FPGA), and/or complex programmable logic devices (CPLD), or any combination thereof. It will also be appreciated that any circuitry can, at least in part, be replaced by processing means, e.g., a processor executing an appropriate software.

Even though the invention has been described in relation to the sensing of binary signals, i.e., signals representing either of two distinct states, embodiments of the invention capable of sensing of digital signals in general, i.e., signals representing more than two distinct states, may be easily envisaged.

Further objectives of, features of, and advantages with, the present invention will become apparent when studying the following detailed disclosure, the drawings and the appended claims. Those skilled in the art realize that different features of the present invention can be combined to create embodiments other than those described in the following.

BRIEF DESCRIPTION OF THE DRAWINGS

The above, as well as additional objects, features and advantages of the present invention, will be better understood through the following illustrative and non-limiting detailed description of embodiments of the present invention, with reference to the appended drawings, in which.

All the figures are schematic, not necessarily to scale, and generally only show parts which are necessary in order to elucidate the invention, wherein other parts may be omitted or merely suggested.

DETAILED DESCRIPTION

Figure 1:
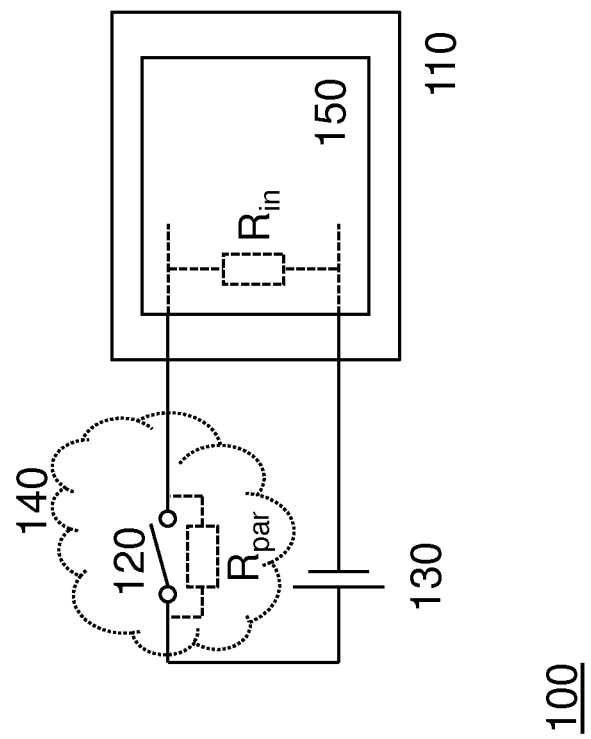
FIG. 1 illustrates parts of an electric power distribution system.

For the purpose of describing the present invention, parts of an electric power distribution system are sketched in FIG. 1. Note that only parts which are relevant for elucidating the invention are shown while other parts are omitted.

Power distribution system 100 comprises a unit 110 for monitoring and/or controlling the power distribution system 100. For instance, unit 110 may be configured for detecting the state of a contact transducer 120, i.e., whether transducer 120 is open or closed. The state of a contact transducer, such as transducer 120, may, e.g., be used to indicate the state of a circuit breaker or the like.

Contact transducer 120, which is illustrated as a mechanical switch in FIG. 1, is powered by battery 130 and connected to a digital input 150 of unit 110. The digital input 150 has an input impedance $R_{in}$ which may be used for detecting the state of transducer 120, as is known in the art. For instance, the digital input 150 may be arranged for detecting a voltage drop over the input impedance $R_{in}$, the size of the voltage drop being indicative of the state of transducer 120. In particular, if transducer 120 is in its closed state, the current through transducer 120 results in a sizeable voltage drop over the input impedance $R_{in}$.

A problem which is commonly encountered in electric power distribution systems is that contact transducers, such as transducer 120, may be exposed to dirt and/or moist. Transducer 120 may, e.g., be located in an environment 140 with high air humidity. Such polluted and/or moist environments may lead to parasitic resistances over open contacts. This is illustrated in FIG. 1, which shows a parasitic resistance $R_{par}$ over the open transducer 120. The parasitic resistance $R_{par}$ may result in a false detection of the state of transducer 120, and, subsequently, in an unwanted shutdown or similar unwanted measures.

Figure 2:
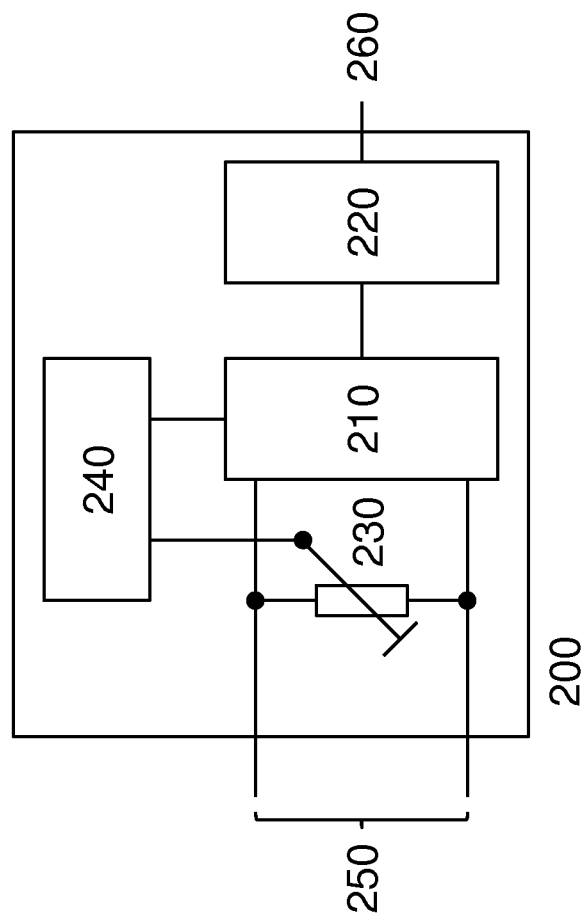
FIG. 2 shows a digital input according to an embodiment of the invention.

With reference to FIG. 2, an embodiment of a digital input according to the invention is described. Digital input 200 may, e.g., be arranged as input 150 in unit 110 described with reference to FIG. 1.

Digital input 200 comprises means for receiving a binary input signal 250 for the purpose of sensing whether signal 250 represents the logical-low state or the logical-high state. For instance, a contact transducer, such as transducer 120 powered by battery 130, described with reference to FIG. 1, may be connected to digital input 200 for the purpose of sensing the state of transducer 120.

Input 200 further comprises means 210 for measuring a signal level of input signal 250, means 220 for determining whether the measured signal level represents a logical-low state or a logical-high state, means 230 for providing a variable input impedance, illustrated as a variable resistor in FIG. 2, and means 240 for controlling the input impedance in response to the measured signal level.

The determination of the actual logical state of input signal 250, which determination is performed by means 220, may, e.g., be achieved by measuring the voltage drop over the input impedance 230, and by comparing the measured voltage drop to threshold values defined for the two logical states. The information about the detected state of input signal 250 may subsequently be provided to other units via output 260.

The ability to control the input impedance 230 of input 200 may be utilized for making the sensing of input signal 250 more reliable. This may, e.g., be achieved by controlling the input impedance 230 such that it is suitable for the actual signal level of signal 250 at any time, i.e., for any given signal level. Preferably, the input impedance 230 is adjusted such that the sensitivity of input 200 is maximized, while at the same time minimizing the disturbance level of the input. The functional relationship between the desired input impedance, provided by means 230, and the measured signal level of signal 250, is described in the following.

Note that, even though means 230 has been described as providing the input impedance, and is illustrated as a variable resistor in FIG. 2, it may not be the sole contribution to the input impedance of digital input 200. Rather, the input impedance of a digital input, such as input impedance $R_{in}$ shown in FIG. 1, has further contributions besides a plain resistor, which contributions originate from other electronic components of the digital input. For the purpose of describing the present invention, a means for providing a variable input impedance, such as means 230, is to be understood as representing a major part of the total input impedance $R_{in}$ of a digital input. Hence, the input impedance $R_{in}$ of a digital input may be controlled by way of controlling the means for providing an input impedance.

Figure 3:
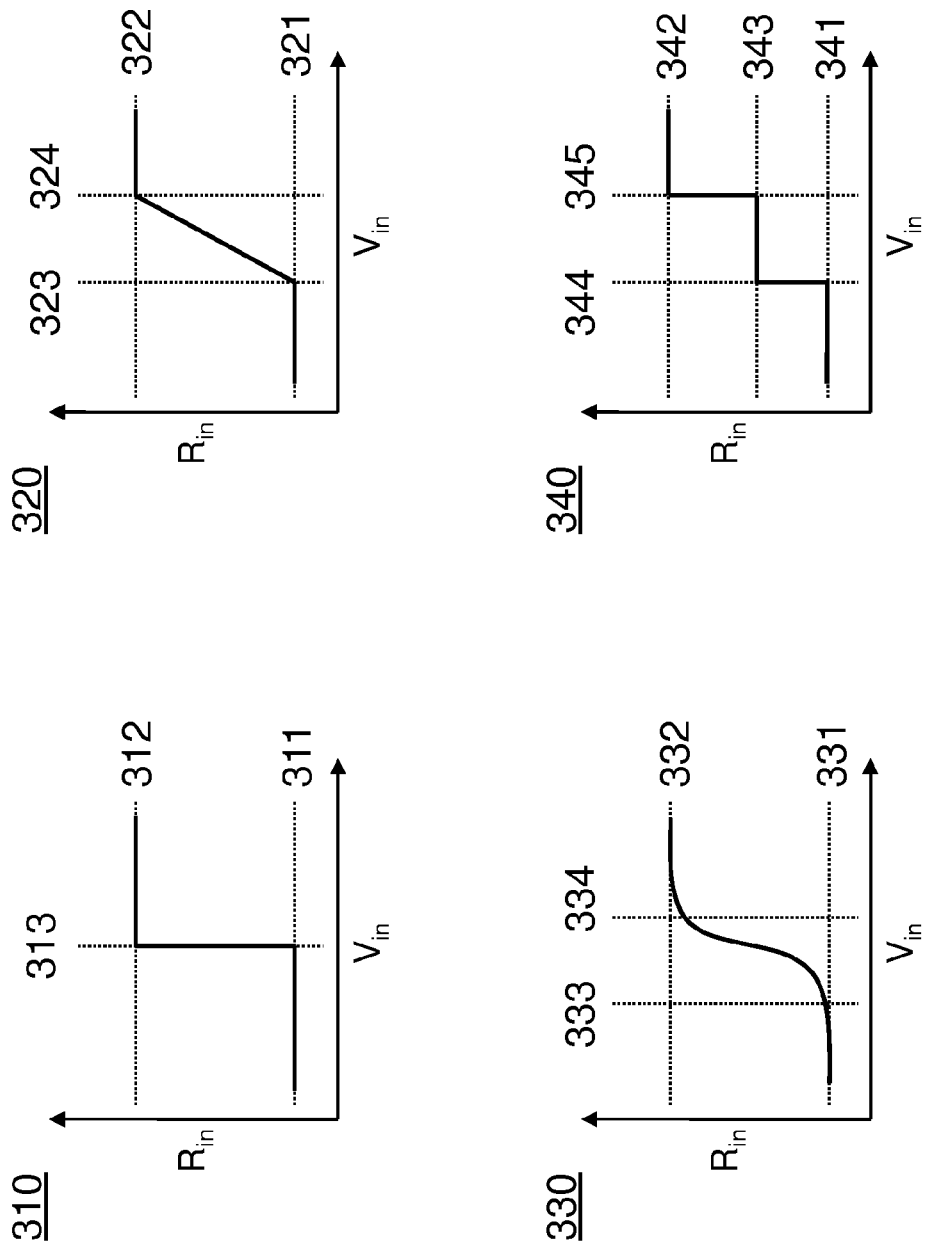
FIG. 3 illustrates the relationship between input impedance and signal level, according to embodiments of the invention.

In FIG. 3, the relationship between the input impedance $R_{in}$ and the measured signal level $V_{in}$ is illustrated by several examples. For instance, the input impedance may be controlled to attain a low value 311 for signal levels below a certain transition level 313, and a high value 312 for signal levels above transition level 313. This functional relationship resembles a step function and is illustrated in diagram 310. The transition level 313 may, e.g., be equal to the transition level defined for the transition between logical-low and logical-high. For instance, if the digital input is implemented in CMOS technology, and the level of an input signal is between 0 and $V_{cc}$, where $V_{cc}$ is the supply voltage, the transition level for the low-to-high transition is typically equal to $V_{cc}/2$. Thus, a signal level between 0 and $V_{cc}/2$ is indicative of the logical-low state, while a signal level between $V_{cc}/2$ and $V_{cc}$ is indicative of the logical-high state. However, the invention is not limited to this choice of transition level.

According to another functional relationship, illustrated in diagram 320, the input impedance may be set to a low value 321 for signal levels below a first threshold 323, may be controlled to increase for signal levels above the first threshold 323 and below a second threshold 324, and may be set to a high value 322 for signal levels above the second threshold 324. In the region between the first 323 and the second threshold 324, the input impedance may be controlled to increase linearly with signal level.

Yet another relationship between input impedance and signal level is illustrated in diagram 330. The sketched relationship resembles the relationship illustrated in diagram 320 but is smoothened out. The input impedance attains a low level 331 at low signal levels and increases slowly with increasing signal level. Around a first threshold 333, the input impedance is controlled to increase more rapidly with signal level. Then, around a second threshold 334, the input impedance is controlled to increase slowly again and eventually approaches its maximum value 332.

Finally, yet a further example of the relationship between input impedance and signal level is illustrated in diagram 340. The latter relationship resembles a combination of multiple step functions. At low signal levels, i.e., below a first threshold 344, the input impedance is set to a low value 341. Above the first threshold 344 and below a second threshold 345, the input impedance is set to an intermediate value 343. For signal levels above the second threshold 345, the input impedance is set to a high value 342.

Figure 4:
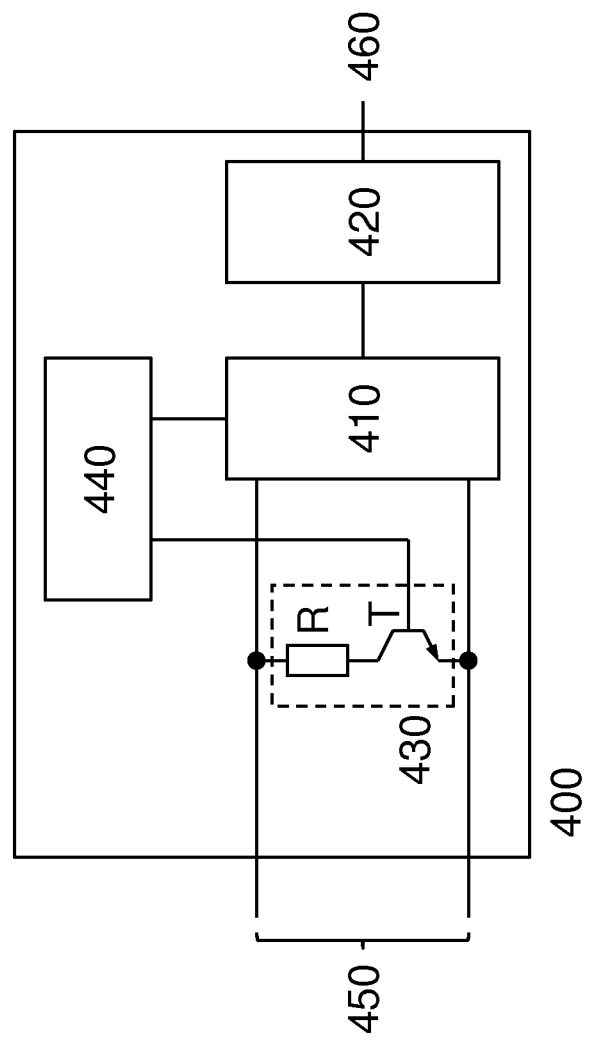
FIG. 4 shows a digital input according to another embodiment of the invention.

In the following, another embodiment of the invention is described with reference to FIG. 4. Digital input 400 is similar to input 200, described with reference to FIG. 2, in that it comprises means 410 for measuring a signal level of an input signal 450, means 420 for determining whether the measured signal level represents a logical-low state or a logical-high state, and an output 460 for publishing the determined state.

Digital input 400 further comprises means 430 for providing a variable input impedance, which means comprises a transistor T and a resistor R, the resistor R being connected in series with the collector of transistor T. Further, means 440 for controlling the input impedance in response to the measured signal level is arranged for controlling the input impedance using PWM. The latter technique involves controlling the duty ratio of transistor T, i.e., the time the transistor is in its on-state as compared to a period of time, by supplying periodic pulses to the transistor's base. The duty ratio may be controlled by adjusting the width of the periodic pulses. To this end, the input impedance may be adjusted between a minimum and a maximum value by controlling the duty ratio of transistor T. The difference between the minimum value and the maximum value is dictated by the value of resistor R.

The means 440 for controlling the input impedance may be constructed using electronic components, readily available circuitry, or a processor executing an appropriate software. Means 440 may be arranged to control the input impedance in response to the measured signal level according to any one of the functional relationships discussed with reference to FIG. 3, or according to any other functional relationship suitable for the application at hand.

The person skilled in the art realizes that the present invention by no means is limited to the embodiments described above. On the contrary, many modifications and variations are possible within the scope of the appended claims. For example, one may easily envisage embodiments of the invention utilizing active-low logic instead of active-high logic. Further, the variable input impedance may be provided in any other way than the PWM controlled transistor-resistor combination disclosed above. For example, one may envisage an electronic component which, when supplied with a voltage, provides a variable resistance through the component, the resistance being a monotonously increasing function of the supplied voltage.

In conclusion, a device for sensing a binary signal is provided. The device comprises means for measuring a signal level of the signal, means for determining whether the measured signal level is "low" or "high", means for providing a variable input impedance, and means for controlling the input impedance in response to the measured signal level. The variable input impedance may be provided by way of a transistor and a resistor, and by controlling the duty ratio of the transistor using PWM. Preferably, the input impedance is controlled to be low for low signal levels and to be high for high signal levels, which results in a more reliable sensing of binary signals. The device may be used for detecting the state of contact transducers suffering from parasitic resistances caused by moist and/or polluted environments. Further, a method of sensing a binary signal is provided.

The invention claimed is:

1. A method of sensing a binary signal indicative of a logical state of a contact transducer and for use in a device for sensing the binary signal the method comprising:
    measuring a signal level of the binary signal,
    controlling an input impedance of said device in response to the measured signal level, such that the input impedance is controlled to have a first value for signal levels smaller than a first threshold and a second value for signal levels larger than a second threshold, the first value being smaller than the second value, and the first threshold being smaller than, or equal to, the second threshold, and
    determining whether the measured signal level indicates a voltage level representing a logical-low state or a logical-high state.

2. The method according to claim 1, wherein the first threshold and the second threshold are equal.

3. The method according to claim 1, wherein the input impedance is controlled to increase with increasing signal level for signal levels larger than the first threshold and smaller than the second threshold.

4. The method according to claim 1, wherein the input impedance is controlled using pulse width modulation, PWM.

5. A device for sensing a binary signal indicative of a logical state of a contact transducer, the device comprising:
    means for providing a variable input impedance;
    means for measuring a signal level of the binary signal,
    means for controlling the input impedance in response to the measured signal level, wherein the means for controlling the input impedance are arranged to control the input impedance to have a first value for signal levels smaller than a first threshold and a second value for signal levels larger than a second threshold, the first value being smaller than the second value, and the first threshold being smaller than, or equal to, the second threshold; and
    means for determining whether the measured signal level indicates a voltage level representing a logical-low state or a logical-high state.

6. The device according to claim 5, wherein the first threshold and the second threshold are equal.

7. The device according to claim 5, wherein the input impedance is controlled to increase with increasing signal level for signal levels larger than the first threshold and smaller than the second threshold.

8. The device according to claim 5, wherein the means for providing a variable input impedance comprises a bipolar transistor and a resistor, the resistor being connected in series with the collector of the transistor, and the means for controlling the input impedance is arranged for controlling the input impedance using pulse width modulation, PWM.

9. A digital input comprising a device according to claim 5.

10. A control unit for an electric power distribution system substation, the control unit comprising a device according to claim 5.

11. A digital input comprising a device according to claim 6.

12. A digital input comprising a device according to claim 7.

13. A digital input comprising a device according to claim 8.

14. A control unit for an electric power distribution system substation, the control unit comprising a device according to claim 6.

15. A control unit for an electric power distribution system substation, the control unit comprising a device according to claim 7.

16. A control unit for an electric power distribution system substation, the control unit comprising a device according to claim 8.

* * * * *